US010797806B2

(12) United States Patent
Adamo et al.

(10) Patent No.: US 10,797,806 B2
(45) Date of Patent: Oct. 6, 2020

(54) ANTENNA STATUS REMOTE MONITORING SYSTEM AND MODULE

(71) Applicant: Firecom Inc., Edgewood, NY (US)

(72) Inventors: Patrick Adamo, Smithtown, NY (US); John Liguori, Deer Park, NY (US)

(73) Assignee: FIRECOM, INC., Woodside, NY (US)

( * ) Notice: Subject to any disclaimer, the term of this patent is extended or adjusted under 35 U.S.C. 154(b) by 25 days.

(21) Appl. No.: 16/297,061

(22) Filed: Mar. 8, 2019

(65) Prior Publication Data
US 2020/0287634 A1    Sep. 10, 2020

(51) Int. Cl.
| | | |
|---|---|---|
| *H04B 17/00* | (2015.01) |
| *H04B 17/10* | (2015.01) |
| *G01R 31/08* | (2020.01) |
| *G01S 13/75* | (2006.01) |
| *H01Q 3/26* | (2006.01) |
| *H04B 17/17* | (2015.01) |
| *H04B 17/19* | (2015.01) |
| *H01Q 1/38* | (2006.01) |
| *H04B 17/16* | (2015.01) |

(52) U.S. Cl.
CPC ........... *H04B 17/104* (2015.01); *G01R 31/08* (2013.01); *G01S 13/753* (2013.01); *H01Q 1/38* (2013.01); *H01Q 3/267* (2013.01); *H04B 17/16* (2015.01); *H04B 17/17* (2015.01); *H04B 17/19* (2015.01)

(58) Field of Classification Search
CPC ........ H04B 17/15; H04B 17/18; H04B 17/29; H04B 17/101; H01Q 1/38; H01Q 1/243
USPC ................... 455/115.1, 115.2; 343/702, 860
See application file for complete search history.

(56) References Cited

U.S. PATENT DOCUMENTS

| | | |
|---|---|---|
| 5,946,373 A | 8/1999 | Harris |
| 7,224,170 B2 | 5/2007 | Graham et al. |
| 7,480,494 B2 | 1/2009 | Ukai |
| 8,254,848 B1 | 8/2012 | Elliott et al. |
| 9,584,191 B2 * | 2/2017 | Hamilton ................ H01Q 1/48 |
| 9,647,706 B2 * | 5/2017 | Salfelner .............. H04B 1/1027 |
| 10,082,569 B1 | 9/2018 | Adam |
| 2002/0093453 A1 | 7/2002 | Vail et al. |
| 2003/0072121 A1 | 4/2003 | Bartel et al. |
| 2006/0145884 A1 | 7/2006 | Graham et al. |

(Continued)

FOREIGN PATENT DOCUMENTS

WO     2016009327 A1     1/2016

OTHER PUBLICATIONS

International Searching Authority, Notification of Transmittal of the International Search Report and the Written Opinion of the International Searching Authority (in PCT Application No. PCT/US/2017/039794), dated Sep. 7, 2017.

*Primary Examiner* — Tung X Le
(74) *Attorney, Agent, or Firm* — Cooper & Dunham LLP

(57) ABSTRACT

An antenna monitoring module electrically coupled to an antenna, the antenna monitoring module including an embedded element in the antenna, test antenna configured to send and receive radio frequency (RF) test signals to and from the antenna, an input blocking module disposed at an input of the antenna monitoring module to facilitate receipt of a master test signal by the antenna monitoring module, an addressable mixed signal processor that determines an integrity of a connection to the antenna and a performance of the antenna based on measurements associated with the RF test signals and the master test signal.

21 Claims, 5 Drawing Sheets

(56) References Cited

U.S. PATENT DOCUMENTS

2014/0206296 A1* 7/2014 Chakraborty ......... H04B 1/401
　　　　　　　　　　　　　　　　　　　　　455/77
2017/0373768 A1　12/2017 Antkowiak et al.

* cited by examiner

ANTENNA STATUS REMOTE MONITORING SYSTEM AND MODULE

FIELD

Embodiments of the invention generally relate to an antenna monitoring system, and more specifically, to an antenna monitoring unit used in a distributed antenna monitoring system that allows for self-diagnosis and control of the system.

BACKGROUND

Background regarding public safety communications systems and fault monitoring in distributed antenna systems is provided in depth in U.S. Pat. No. 10,082,569 of Patrick Adamo, the entirety of which patent and application therefor (Ser. No. 15/636,431) is hereby incorporated by reference.

Traditional public safety communications systems and cellular radio systems are often unable to effectively receive or transmit voice and data communications throughout a well-shielded building from sources outside the building, for example due to "dead zones."

Systems ensuring radio coverage for public safety signals within buildings are nonetheless often required by law and model codes.

New York City's Building Code, for example, requires an in-building auxiliary radio communication (ARC) system for certain buildings, which must in turn be tested, operated and maintained. Some ARC systems require periodic monitoring of the various portions of a Radio Frequency Distributed Antenna System (RF-DAS), including self-testing.

U.S. Pat. No. 7,224,170 entitled "Fault Monitoring in a Distributed Antenna System" seeks to ensure functioning of multiple antennas throughout a structure. The '170 patent describes a central monitoring unit and a plurality of antennas coupled to the central monitoring unit through a network. Each antenna includes an antenna monitoring unit, which seeks to confirm that the associated antenna is connected. To this end, the antenna monitoring unit includes a measurement circuit for measuring a current drawn by its associated antenna and a reporting component for outputting a status message to the central monitoring unit. The current drawn by the antenna is measured and compared against a reference level. The measured level of current drawn by the antenna is assumed to be indicative of whether the antenna is connected.

In the '170 patent's system, the fault monitoring communication path to the antenna network is not isolated from the antenna signal path, and teaches that any two-way communication to the antenna monitoring unit 22 uses "low frequency signals." Additionally, with reference to FIG. 2, the '170 patent is focused on a grounded type antenna.

In addition, the '170 patent mentioned in U.S. Pat. No. 10,082,569 does not provide a system that effectively provides detailed health monitoring capacity using two-way, low bandwidth data flow.

The '569 patent addresses certain of the deficiencies in the above-mentioned prior art by providing, inter alia, a system for remote monitoring a network of distributed antennas comprising an antenna and a specially configured monitoring module electrically coupled to an RF transmission line, the monitoring module configured to operate with a DC coded signal coming from a specially configured DC master controller to determine antenna status.

The systems and methods of the present invention provide for additional improvements over the above-identified references, including by effectively providing detailed health monitoring capacity using communications mixed with RF data that allows two-way, low bandwidth data flow, and by providing systems with antenna monitoring systems that monitor both a primary and a secondary or test antenna, including as part of a larger, multi-antenna-monitoring system distributed antenna system.

SUMMARY

Embodiments of the present invention can provide an exemplary antenna monitoring module electrically coupled to an antenna, the antenna monitoring module having an embedded element in the antenna, a test antenna configured to send and receive radio frequency (RF) test signals to and from the antenna, an input blocking module disposed at an input of the antenna monitoring module to facilitate receipt of a master test signal (which may include power and encoded data) by the antenna monitoring module, and an addressable mixed signal processor that determines an integrity of a connection to the antenna and a performance of the antenna based on measurements associated with the RF test signals and the master test signal. The input blocking module may include an input direct current (DC) blocking module. The antenna monitoring module may have a direct current (DC) output blocking module disposed at an output of the antenna monitoring module to the antenna. The antenna monitoring module have an end of line detection module in communication with the addressable mixed signal processor to compare measurements associated with the embedded element and the master test signal against an expected value to determine the integrity of the connection to the antenna, which embedded element may include at least one of an inductor, a resistor, and a capacitor. The addressable mixed signal processor may be configured to compare voltage standing wave ratio (VSWR) measurements associated the RF test signals against an expected VSWR value to determine the performance of the antenna. The antenna monitoring module may include a directional coupler controlled by the addressable mixed signal processor and configured to pass signals between the input block module and the antenna, and further may have a second directional coupler controlled by the addressable mixed signal processor and configured to pass signals between an RE transmitter and the test antenna, and/or further may have an RF switch in communication with the addressable mixed processor and with the directional coupler to selectively facilitate transmission by the directional coupler. The antenna monitoring module may have a calibrated splitter connected to the input blocking module to electrically couple the antenna monitoring module to a distributed antenna network. The antenna monitoring module may have indicator lights configured to be selectively controlled by the addressable mixed signal processor based on the determination of the integrity of the connection to the antenna and the performance of the antenna. The processor may be adapted to perform bidirectional communication with a global transmitter and receiver, and further the bidirectional communication may be by pulse-coded DC signal, a series of current pulses, AM radio signal, or FM radio signal. The distance between the antenna and the test antenna may be at least two times the wavelength of signals used by the antenna monitoring system.

In some embodiments, there is a distributed antenna network with a plurality of antennas, a global transmitter and receiver, and an antenna monitoring module associated with each of the plurality of antennas, the antenna monitoring module electrically coupled to the global transmitter and receiver via a calibrated splitter and including an element embedded in the antenna, a test antenna configured to send and receive radio frequency (RF) test signals to and from the antenna, an input blocking module disposed at an input of the antenna monitoring module to facilitate receipt of a master test signal from the global transmitter by the antenna monitoring module, and an addressable mixed signal processor that determines an integrity of a connection to the antenna and a performance of the antenna based on the RF test signals and the master test signal. The at least one calibrated splitter may include a plurality of calibrated splitters, and the at least one antenna monitoring module may include a plurality of antenna monitoring modules each electrically coupled to one of the plurality of calibrated splitters. Further, the plurality of calibrated splitters may be DC pass-through calibrated splitters adapted to portion out RF energy to the plurality of antenna monitoring modules, and/or the antenna monitoring system may include a main power source, such that power provided by the main power source is presented to the plurality of calibrated splitters and the plurality of antenna monitoring modules. The plurality of splitters may allow for flow of low frequency data between the global transmitter and receiver and the plurality of antenna monitoring modules. The antenna monitoring system may include a main power source, such that power provided by the main power source is presented to the plurality of calibrated splitters and the plurality of antenna monitoring modules. The distance between the antenna and the test antenna monitored is may be least two times the wavelength of signals used by the at least one monitoring module.

DETAILED DESCRIPTION

Figure 1:
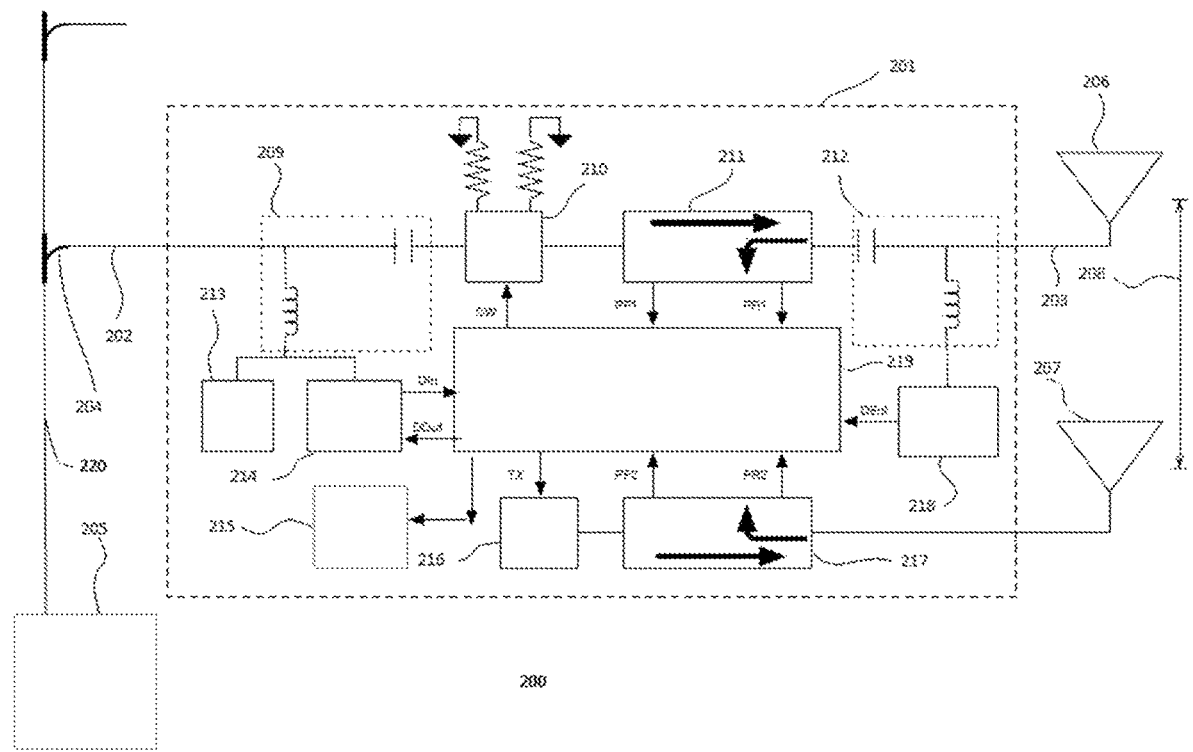
FIG. 1 is a block diagram illustrating a configuration of a distributed antenna system including an antenna monitoring system according to an embodiment of the present invention.

Referring now to the drawings, wherein like reference numerals designate corresponding structure throughout the views.

FIG. 1 shows a distributed antenna system 200 having an exemplary antenna monitoring system 201 according to an embodiment of the present invention. Exemplary antenna monitoring system 201 can facilitate testing the connection and the performance of the antenna over existing connections and/or the connections that provide power to the antenna. As shown in FIG. 1, distributed antenna system 200 can include one or more antenna 206; 207, a system transmitter and receiver (Tx/Rx) 205, power supply 213, and antenna monitoring system 201 for each antenna or set of antennas 206; 207 electrically coupled thereto, that is, for each antenna or paired or otherwise associated antenna set 206; 207 contained in distributed antenna system 200. The exemplary antenna set 206; 207 shown includes both a (optionally ARCS) primary antenna 206 and also a secondary or test antenna 207, although, in other embodiments, a single antenna (e.g. 206) or other combinations of antennas may be used. In certain embodiments, secondary or test antenna 207 can be used, or used exclusively, for testing purposes. In certain further embodiments, secondary or test antenna 207 can be included as part of antenna monitoring system 201. System transmitter and receiver 205 may be the main system transmitter and receiver for distributed antenna system 200 and may be used to send and receive radio frequency (RE) signals throughout distributed antenna system 200 to primary antenna 206. Tx/Rx 205 can be electrically coupled to each antenna monitoring system 201 and primary antenna 206 via a bidirectional bus 220. Each antenna monitoring system 201 and primary antenna 206 can be electrically coupled to bus 220 via calibrated splitter 204. Distributed antenna system 200 can have any number of antenna 206 and antenna monitoring system 201, as desired. For example, if distributed antenna system 200 is implemented in a building to provide a system for emergency communications (e.g., fire, police, etc.), distributed antenna system 200 can include an antenna 206 for each wing or floor of the building. Other designs and implementations of distributed antenna system 200 are contemplated by embodiments of the present invention.

As shown in FIG. 1, system transmitter and receiver (Tx/Rx) 205 may be a device or may be comprised of a plurality of devices capable of performing the sending and receiving data to each antenna 206 in distributed antenna system 200. For example, Tx/Rx 205 can send and receive an encoded and/or modulated low-frequency bidirectional RF signal having digital and/or analog data throughout distributed antenna system 200 to primary antenna 206. According to certain exemplary embodiments, the signal generated by Tx/RX 205 can include a low-bandwidth, low-frequency (e.g., 1 kHz) signal having data encoded and/or modulated thereon. For example, the signal can have a bandwidth of approximately 1,000 bits per second. The signal, in further embodiments, may be in the form of short pulses, for example, with differing DC levels, that transmit the generated signal (which may, for example, include information signals and/or control signals) to antenna monitoring system 201. Signals, in certain embodiments, may be returned from the antenna monitoring system 201 to the Tx/Rx 205 in a different form, for example, pulse-coded current pulses at or around 20 mA. According to embodiments of the present invention, the signal generated by Tx/Rx 205 can be provided to each antenna 206 and antenna monitoring system 201 via bus 220 and splitter 204. Secondary or test antenna 207 can be used, or used exclusively, for testing purposes. For example, secondary or test antenna 207 can send communications to primary antenna 206 to test the reception capabilities of primary antenna 206, and secondary or test antenna 207 can receive communications from primary antenna 206 to test the transmission capabilities of primary antenna 206. Secondary or test antenna can be 207 can be included as part of antenna monitoring system 201.

The antenna monitoring system 201 or plurality of such systems, for example as embodied in the system described, may have, or be configured to have, a number of advantages. The antenna monitoring system(s) 201 may indicate in a building or other site database the specific location of each uniquely addressed antenna monitoring system(s) 201. For example, the specific locations may be manually determined or determined prior to installation and inputted into a storage associated with processor 219 of each antenna monitoring system 201, which may in turn be transmitted for storage or periodically signaled to an assigned central or distributed component of the antenna distribution system 200, such as a database included within or associated with Tx/Rx 205. The system may selectively indicate an antenna communications failure problem at the specified address and/or building location in the event that the processor 219 (which may itself be addressable) cannot be communicated with.

Power can be provided throughout distributed antenna system 200 via bus 220 and splitter 204. According to certain exemplary embodiments, the power supply powering distributed antenna system 200 can include a connection to the power supply of the building in which distributed antenna system 200 is deployed, or a separate power supply (e.g., a separate connection to the power grid, batteries, generators, emergency backup power, etc.). Preferably, bus 220 can also carry signals that provide testing of the antenna by antenna monitoring system 201. In certain embodiments, low voltage DC power may be used. For example, 12-volt DC power, 24-volt DC power, or other DC power may be used. According to certain exemplary embodiments, power may be generated by a battery-backed power supply. According to certain exemplary embodiments, Tx/Rx 205 may mix the power with RF antenna signals, for example, via the use of a Bias-T, as signals, such as data and/or control signals, are transmitted from the Tx/Rx 205 to the antenna monitoring system 201. According to certain exemplary embodiments, the voltage may be modulated to a pulse-coded 33 volts signal. Such exemplary pulse-coded system may employ pulse code modulation, Manchester-encoded edges, or a combination thereof. Other methods of pulse-encoding may be used, alternately or in addition to the foregoing. In certain embodiments, the signal may be in a different form when sent by the antenna monitoring system 201 to Tx/Rx 205. According to certain exemplary embodiments, a series of current pulses may be sent, such as 20 mA current pulses at specific time intervals/windows, and such signals may be sent using the mere existence of a bit or bits as signal-indicative, or may be coded according to pulse length, pulse code, Manchester encoding, and/or other simple or more complicated coding method(s).

As shown in FIG. 1, each antenna monitoring system 201 and primary antenna 206 can be electrically coupled to bus 220 via splitter 204. Splitter 204, which may be a calibrated splitter, may be used to portion appropriate amounts of RF energy to each antenna monitoring system 201 and primary antenna 206 such that each antenna monitoring system 201 and primary antenna 206 receives the RF signal generated by Tx/Rx 205. According to certain embodiments, splitter 204 allows for DC and/or low-frequency signals to be passed-through from bus 220 to each antenna monitoring system 201 and primary antenna 206. Preferably, each antenna monitoring system 201 and primary antenna 206 incorporated into distributed antenna system 200 can be coupled to bus 220 via splitter 204. Accordingly, if distributed antenna system 200 includes ten primary antennas 206 and ten corresponding antenna monitoring systems 201, distributed antenna system can include ten splitters 204, one for each primary antenna 206 and corresponding antenna monitoring system 201.

As shown in FIG. 1, embodiments of the present invention can provide antenna monitoring system 201. Antenna monitoring system 201 can be electrically coupled to each antenna 206 to monitor the connection and health of antenna 206. As shown in FIG. 1, antenna monitoring system 201 can contain an input block 209 connected to a power supply 213, a data transmission and reception device 214, and an RF switch 210. The RF switch 210 can be connected to a directional coupler 211, which can be connected to an output block 212, which can be connected to an end of line detection device 218. The data reception and transmission device 214, the RF switch 210, the directional coupler 211, and the end of line detection device 218 can be connected to a processor 219. The processor 219 can also be connected to indicator lights 215, an RF transmitter 216, and a second directional coupler 217. The RF transmitter 216 can be connected to the second directional coupler 217. In certain embodiments, antenna monitoring system 201 can also include secondary or test antenna 207, which can facilitate monitoring the health and performance of primary antenna 206. The antenna monitoring system 201 according to embodiments of the present invention may optionally have its various components contained internally within a monolithic package and/or may be in the form of a module, or alternately some or all of such components may be distributed and/or not contained within such a package or module. The antenna monitoring system 201 can operate, in certain embodiments in parallel with other such systems monitoring other antennas, to monitor the status, health, and/or performance of an associated primary antenna 206, with additional testing options made possible by association with a secondary or test antenna 207, and to distribute such monitoring information. For example, antenna monitoring system 201 can receive an encoded and/or modulated low-frequency signal from Tx/Rx 205 and test the status, connection, health, and/or performance of associated primary antenna 206. Further, antenna monitoring system 201 can transmit the status, connection, health, and/or performance of primary antenna 206 back to Tx/Rx 205 through the use of associated indicator lights 215 and/or by passing such monitoring information to the bidirectional bus 220 and thereby to the transmitter and receiver 205 (which passing of information can be accomplished through the use of a data reception and transmission device 214, which may be associated with a power supply 213 and an input block 209 with an external connection). The antenna monitoring system 201 can operate to control the passing of signal information between Tx/Rx 205 and primary antenna 206, and also to control the passing of testing information from itself to each of primary antenna 206 and secondary or test antenna 207, for example by the use of a processor 219 controlling settings of a RF switch 210 (which can cooperate with directional coupler 211) with respect to the primary antenna 206, and by signaling and controlling settings of a RF transmitter 216 (which can cooperate with second directional coupler 217) with respect to the secondary or test antenna 207. The antenna monitoring system 201, in monitoring the primary antenna 207, can take special advantage of the presence of an end of line detection device 218 and output block 212 for detection of electrical flows (or absences thereof) consistent with proper or improper operation of the primary antenna 206, thereby more efficiently delivering an indication of primary antenna's 206 operation to processor 219. In certain additional embodiments, the antenna monitoring system 201 can also monitor the secondary or test antenna 207 by taking advantage of the presence of an end of line detection device 218 for detection of electrical flows (or absences thereof) consistent with proper or improper operation of the secondary or test antenna 207, thereby more efficiently delivering an indication of secondary or test antenna's 207 operation to processor 219. In certain of such additional embodiments, secondary or test antenna 207 may be connected (not shown) to end of line detection device 218, for example, to facilitate such detection. Most functions of antenna monitoring system 201 can be carried out under control of processor 219. For example, processor 219 can control transmission and reception of data to a broader distributed antenna system 200, transmission of a signal between primary antenna 206 and such distributed antenna system 200, testing of primary antenna 206 and secondary or test antenna 207, and indication of problem, fault, or trouble conditions both locally and more broadly to the distributed antenna system 200.

Signals, which can be low frequency signals, and which can include an associated address (which can be uniquely coded) of a particular antenna monitoring system 201, can be transmitted by Tx/Rx 205 to antenna monitoring system 201, or, in embodiments in which the distributed antenna system 200 has plurality of antenna monitoring systems 201, to some or all of the antenna monitoring systems 201. Advantageously, this allows for the transmission of both data and power on the same line or connection. The signal can initially be transmitted from Tx/Rx 205 (via bidirectional bus 220, splitter 204 and wires 202) to input block 209 of antenna monitoring system 201. Input block 209 may be an input DC block. The input block 209 may, in certain embodiments, separate DC power and low frequency communication signals from the RF signal path. For example, input block 209 can include a capacitor or capacitive network, to filter out DC and/or low frequency components from the signal. The input block 209 can also include an inductor or inductive elements, to filter AC and/or high frequency components from the signal. Accordingly, the DC and/or low frequency components of the signal can be provided to data reception and transmission device 214 and the AC components of the signal can be provided to RF switch 210, which can be controlled by processor 219. Such AC and/or high frequency components can selectively pass through RF switch 210 to the directional coupler 211, for example, according to a setting supplied by the processor 219. The DC and/or low frequency components of the signal, which pass from input block 209 to data reception and transmission device 214, can in turn provide the data to processor 219. Processor 219 can determine, for example, by comparison of an address associated with the signal and with antenna monitoring system 201 (or the associated primary antenna 206), whether the DC and/or low frequency components of the signal—and the data provided by same—is intended for the antenna monitoring system 201 (or the primary antenna 206 associated therewith). Directional coupler 211, which can be controlled by processor 219, can pass the AC and/or high frequency components of the signal to output block 212, which can in turn pass them to primary antenna 206. Directional coupler 211 can also send an indication to processor 219 associated with the directional coupler's transmission of AC and/or high frequency components of the signal to primary antenna 206, or of the primary antenna's 206 response thereto. Signal flow from the primary antenna 206 to Tx/Rx 205 can also occur in the reverse of the directionality as outlined above.

As described herein, antenna monitoring system 201 can perform tests to determine the status, connection, health, and/or performance of primary antenna 206. For example, to test the connection of primary antenna 206, an element (e.g., a inductor, resistor, or other circuit component) can be used. To do so, a signal can be sent to primary antenna 206 through a capacitor or capacitive elements of output block 212, and thereby a AC and/or high frequency component of the signal can be delivered to the primary antenna 206, which primary antenna 206 can have an embedded element (which can be, for example, an inductor and/or resistor, or other known circuit element(s) embedded within or associated with primary antenna 206). For example, the embedded element can include an inductor in series with a resistor. In certain embodiments, such element may be in the DC path of primary antenna 206, and in certain embodiments may be positioned between a main conductor and a shield/return of primary antenna 206. The presence of a characteristic response to the signal by the embedded element can be determined by end of line detection device 218. For example, end of line detection device 218 can perform a comparison of the measured value against the expected value to determine the presence or absence of electronic data consistent with the presence and/or proper functioning of primary antenna 206 (which can include the connection, reception, specification-conformity and/or transmission status of the primary antenna 206). For example, a determination can be made as to whether there is a match between the indicative output data from output block 212 and that known by end of line detection device 218 to normally be received during functional operation of primary antenna 206 (i.e. when primary antenna 206 is successfully sending and receiving messages from Tx/Rx 205). End of line detection 218 device can then transmit its determination to processor 219. Alternately, such determination can be made by the processor 219.

Antenna monitoring system 201 can also facilitate testing of the connectivity of primary antenna 206. For example, testing of the primary antenna 206 performance can be performed using Voltage Standing Wave Ratio (VSWR) measurements. To perform such a VSWR measurement to test the connectivity of the primary antenna 206 along with its associated wiring (for example, the wiring between the processor 219 or end of line detection device 218, on the one hand, and primary antenna 206 on the other), power can be transmitted to the primary antenna 206 and compared to reflected power back from primary antenna 206 to obtain a ratio of the transmitted power compared to the reflected power. In performing a VSWR measurement, a ratio of 1:1 of transmitted to reflected power, for example, would be ideal, and a ratio of 1:2.5 of transmitted to reflected power or worse may be indicative of a problem or fault condition such as a disconnected primary antenna 206, a faulty connection, or an inefficient antenna design, and may result in the sending of an indication signal of the problem via the processor as discussed herein. The VSWR determination can be made by the processor 219 based on the AC and/or high frequency components of the received reflection and/or accompanying indications of reception strength relative to the test power sent. In certain embodiments, the VSWR determination can involve a determination of whether the VSWR measurement is equivalent to or better than results obtained when the primary antenna 206 is known to be functioning correctly, or than a supplied fixed threshold value. The VSWR measurement can be determined, for example, according to the formula (1+|reflection coefficient|)/(1−|reflection coefficient|). The VSWR and reflection coefficient can be determined according to the various voltage measurements (or amplitude) of the reflected voltage wave associated with the indicative output data. In certain embodiments, the VSWR can be performed with the primary antenna operating at or around 345 MHz, or around 345 MHz to 370 MHz. Local RF voltage may be used in the VSWR measurement.

There can also be testing of the primary antenna 206 using a test transmission from secondary or test antenna 207. For example, a test transmission may be sent to the secondary or test antenna 207 by the processor 219, via the second directional coupler 217 (under the control of the RF transmitter 216 which can be under the control of processor 219) to the secondary or test antenna 207. The test antenna 207 then transmits the test transmission. The test transmission can be made, for example as shown in FIG. 2B at 345 MHz, and received at the primary antenna 206. The received test transmission and/or accompanying indications of reception strength can pass from primary antenna 206 to output block 212, and then by passing through a capacitor or capacitive element of output block 212 AC and/or high frequency components thereof can be passed to directional coupler 211 and ultimately back to processor 219, for example through PF1 and/or PR1 outputs of directional coupler 211.

To perform a measurement to test the transmission capabilities of the primary antenna 206 using a test transmission to secondary or test antenna 207, a test transmission can be sent to the primary antenna 206 by the processor 219, via the directional coupler 211 (under the control of the RF switch 210 which can be under the control of processor 219) and output block 212. The primary antenna 206 then transmits the test transmission. The test transmission can be made, for example as shown in FIG. 2B at 345 MHz, and received at the secondary or test antenna 207. The received test transmission and/or accompanying indications of reception strength can pass from secondary or test antenna 207 to second directional coupler 217 and ultimately back to processor 219, for example through PF2 and/or PR2 outputs of second directional coupler 217. The determination can be made by the processor 219 based on the received test transmission and/or accompanying indications of reception strength.

With respect to the spacing of primary antenna 206 and secondary or test antenna 207 associated with an antenna monitoring system 201, in certain embodiments, the distance 208 between the primary antenna 206 and the secondary or test antenna 207 (which may in certain embodiments be included as part of the antenna monitoring system 201) may be approximately two times the wavelength of the signals used by the system. In other embodiments, the distance 208 may be equal to two times the wavelength of the signals used by the system. In yet other embodiments, the distance 208 may be greater than or equal to approximately two times the wavelength of the signals used by the system. In yet more embodiments, the distance 208 may be greater than or equal to two times the wavelength of the signals used by the system. In additional embodiments, the distance 208 may be greater than two times the wavelength of the signals used by the system.

An indication signal can be outputted by the processor if a determination is made that there is a problem with primary antenna 206, or if there is any other problem, fault, or trouble condition. Such indication signal can be outputted by processor 219 to Tx/Rx 205 (for example via data reception and transmission device 214, input block 209, wire 202, splitter 204, and bidirectional bus 220) and/or to indicator lights 215 so as to indicate to a user or repair person that there is, or the nature of, a problem with primary antenna 206. For example, the indication signal can report that there is a problem with the primary antenna 206 as determined based on the end of line detection device's determination that there was a failure to match an expected characteristic response (as filtered through an inductor or inductive elements of output block 212) of embedded elements of primary antenna 206. The indication signal can also report that there is a problem with the primary antenna's 206 reception or transmission capabilities as measured at the processor 219 using VSWR measurement based on transmissions between the primary antenna 206 and the secondary or test antenna 207.

Additional methodologies may be employed for the purposes of confirming whether or not antennas are operational and their signal strength. In certain embodiments, the RF switch 210 may be used to enable and/or disable the signal path to primary antenna 206. This may be done upon a command from the transmitter and receiver (Tx/Rx) 205 and/or its cabinet, which may be processed and acted upon, by the sending of a signal to RF switch 210, by processor 219. The performance of another, remaining, connected antenna within the building may be tested. Advantageously, this test may ensure there is enough redundant coverage when an antenna is missing. A lower or higher transmission level to primary antenna 206 may be selected. This may advantageously allow signal coverage to be modified, and advantageously this may be done without replacing equipment and/or adding attenuators, thereby saving labor and material costs. A single-service technician walk-testing sequence may be performed. In such a walk-testing sequence, one antenna may be enabled at a time, and one or more or all of the various antennas may be enabled sequentially. Primary antenna 206, for example if it is determined to have a physical failure, may be turned off. This may advantageously prevent primary antenna 206 from affecting other antennas in the system.

Advantageously, according to various of the above-described embodiments, some or all system faults may be detected. The system faults may advantageously be repaired, and this may occur before a firefighter or other individual or system relies on the system performance. The verification processes may be used at all or nearly all times, e.g. 24/7. Power supply 213 may be used to store and/or stabilize available operating power, which operating power may be DC operating power. The power from the power supply 213 may be distributed, for example, throughout one or more or all of the other components of the antenna monitoring system 201, and/or the primary antenna 206, and or the secondary or test antenna 207, (for example, in those embodiments in which such secondary or test antenna may not be part of antenna monitoring system 201) and/or the communications infrastructure to the bidirectional bus 220 such as wire 202 and splitter 204 or any repeaters or other infrastructure such as may be necessary to ensure signal reception and delivery. In some embodiments, talk/listen system signals and operational power, such as DC power and such as for the distributed antenna electronics and/or the communication signals for uplink and downlink operation may be delivered over the same RF cable.

Figure 2A:
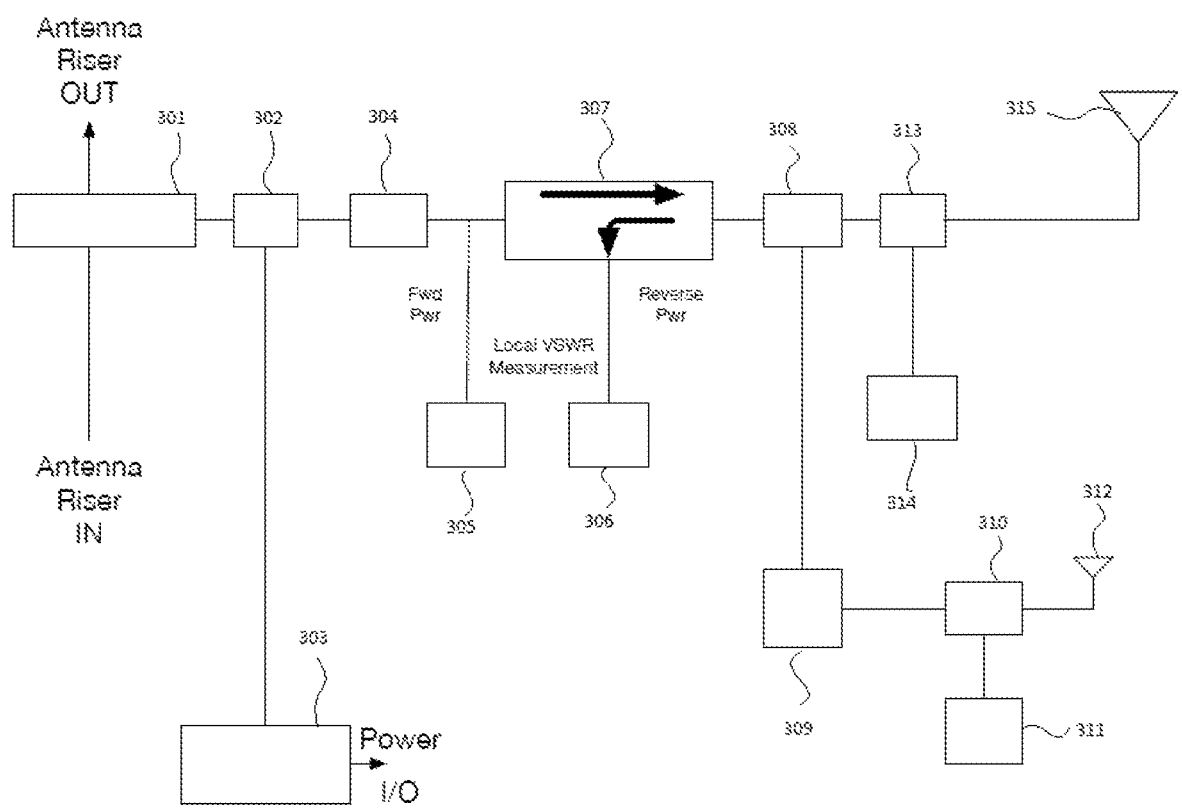
FIGS. 2A-2C are block diagrams illustrating telemetry and controls for a distributed antenna system according to an embodiment of the present invention.
Figure 2B:
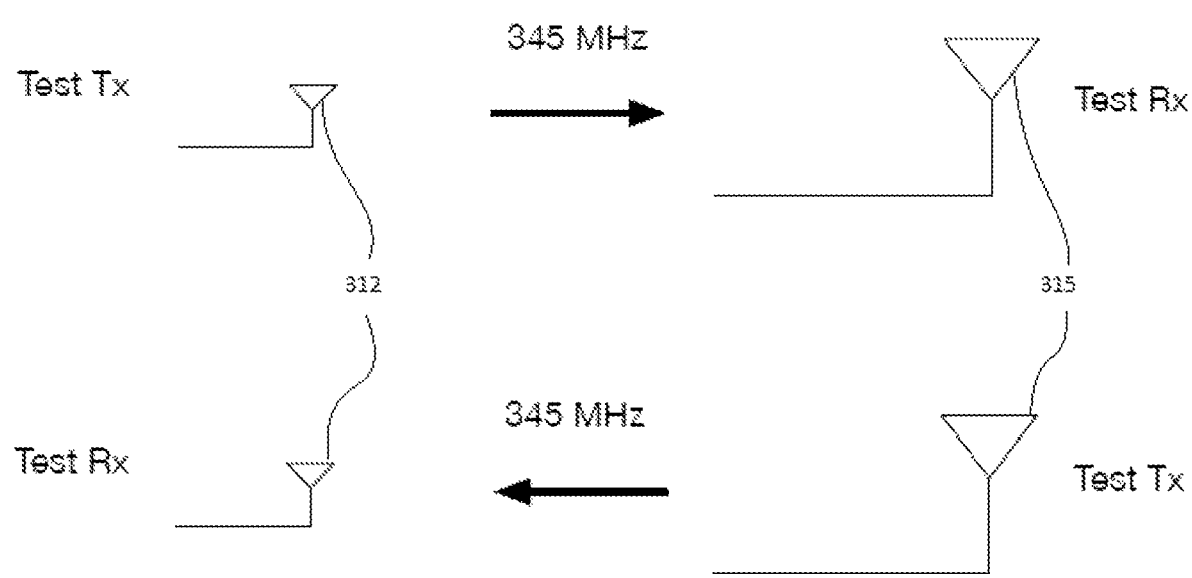
Figure 2C:
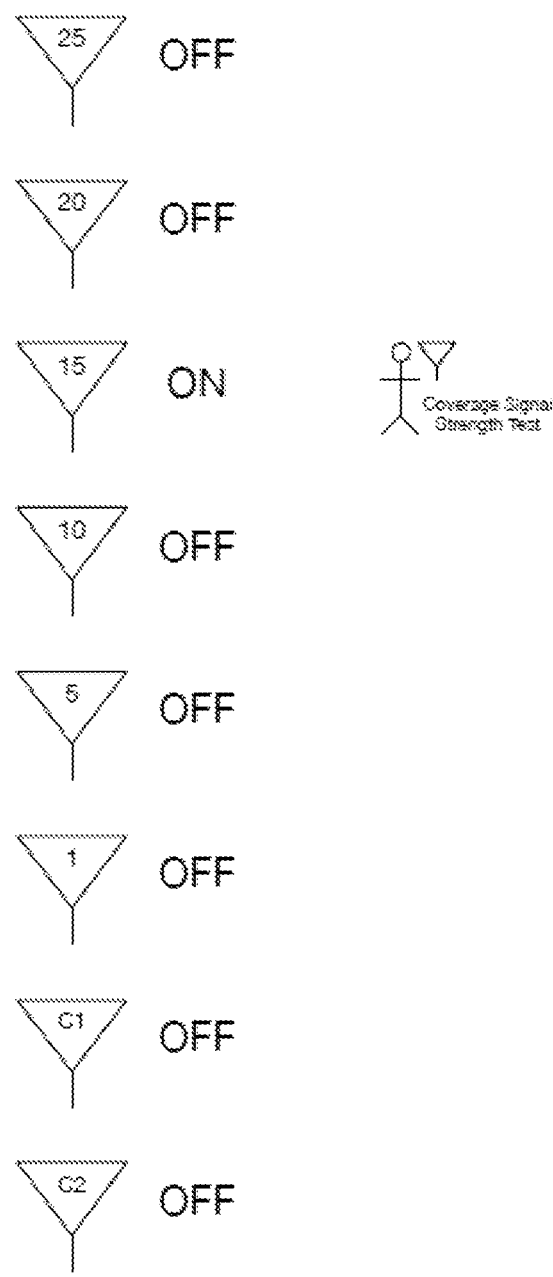

FIGS. 2A-2C show, in block diagram form, an exemplary telemetry and control system for a distributed antenna system 200, including exemplary testing procedures in connection therewith, according to an embodiment of the present invention.

It will be understood that FIG. 2A can be understood in terms of a version of FIG. 1 in block diagram form with additional detail, and that the functionality of like components can be understood with reference to the above description of FIG. 1.

As shown in FIG. 2A, the exemplary telemetry and control system can allow a signal (for example, to or from a Tx/Rx 205 of a distributed antenna system 200 as discussed in connection with FIG. 1 above—not pictured) to pass into or out of on optionally programmable tap (or input/output) function 301 of the telemetry and control system via an antenna riser IN (which may for example be 30-Watt) and OUT, respectively. The signal can travel between the tap function 301 and a DC block 302 (which may have a 1-Watt maximum). The DC block 302 may be structured, for example, in the manner of input block 209 as discussed above in connection with FIG. 1. The signal can pass between DC block 302 and switch 304. Switch 304 can selectively control (for example in the manner of the RF switch 210 or RE transmitter 216 discussed above in connection with FIG. 1) whether the signal is passed along further within the system in the general direction of the primary antenna. For example, an addressable device 303 (which may be connected to a Power I/O) in communication with the switch 304 via the DC block 302 can receive the signal and determine whether the signal is embedded with an address corresponding to that of the addressable device 303, and control the selective operation of the switch, and whether the switch should pass along the signal to directional coupler 307 accordingly. The switch 304 can pass the signal to a converter 305 (The various converters discussed herein can optionally be ND—analog to digital—converters) and a coupler 307, which can in turn pass the signal to an additional converter 306 and a switch 308. The switch 308 can pass the signal between itself and a DC block 313 (which can be understood with respect to the output block 212 of FIG. 1) in communication with an end of line detection device 314 (which can be understood with respect to the end of line detection device 218 of FIG. 1. The DC block 313 can pass the signal between itself and primary antenna 315.

A test transmitter (Tx) 309 can be connected to, and can selectively control, switch 310 (which can be in communication with converter 311) and switch 312, which switches allow for the selective passing of a test signal generated by test transmitter (Tx) 309 to between test transmitter (Tx) 309 and primary antenna 315 and/or secondary or test antenna 312. Thus, testing signals, for example as can be used in the VSWR tests as discussed above in connection with the VSWR of FIG. 1, can be selectively sent via test transmitter (Tx) 309 to each of primary antenna 315 and secondary or test antenna 312. For testing purposes, the receiving antenna 309 can transmit the test signal to the other antenna, and VSWR analysis can be performed (again, with reference to the description accompanying FIG. 1). In certain embodiments, as shown in FIG. 2B, the VSWR determination can be performed with the primary antenna operating at or around 345 MHz. Local RF voltage may be used in the VSWR measurement.

Determinations of the operability and strength of the primary antenna 315 may also be made using a test transmission signal from the test transmitter (Tx) 309 and the end of line detection device 314, for example in the manner discussed in connection with the end of line detection device 218 of FIG. 1.

In further embodiments, complementary frequencies and/or the same frequencies may be used for testing and for use of systems according to embodiments of the present invention. In certain embodiments, such frequencies are at or around 345 MHz, and/or at or around the range of 345 MHz to 370 MHz. Use of such frequency selection may allow simultaneous system operation and test sequences, and may allow for testing in both transmit and receive directions. Local Tx vs global Tx and/or Local Rx vs global Rx may be employed. For example, locally-determined VSWR or other measurements for transmissions from or reception to the primary antenna 315, such as Local RF Receive Signal Strength (RSSI), can be compared against globally-determined values. Advantageously, the comparison of local and global transmission and reception values may allow for simple "triangulation" and/or "strongest here" location services.

The sequencing used for the testing of the various antennas 206; 207; 312; 215 may be for example, according to exemplary sequencing as indicated in FIG. 2C. In certain embodiments, such sequenced testing may be performed by having the outputs commanded on and/or off via an addressable polling protocol. Thus, each antenna within a distributed antenna system 200 can be sequentially tested in a relatively stand-alone fashion. In FIG. 2C, for example, an example block diagram showing an illustration in the midst of one exemplary sequential coverage signal strength testing process is shown, coverage signal strength testing is currently occurring at one primary antenna (15) from amongst a plurality of such primary antennas in a distributed antenna system 200, with testing at 2 other antennas having previously occurred, and testing at 5 other primary antennas yet to have occurred. Accordingly, it can be ensured that each of the antennas is capable of proper RF performance. During this process of sequential testing, signaling of a small scale transmission at a "nearby" frequency that can be received by the antenna and measured by the RSSI detector can also be employed. For example, the primary system frequencies may be used, all antennas may be electronically disconnected, and then the antennas can be electronically reconnected one at a time and tested. Advantageously, this would test the reception capability of the antenna during times of inactivity, and may be used to ensure that the antenna closest to the tester is properly receiving signals.

Thus, according to various of the embodiments of the present invention discussed herein, the system may serve as a low-cost communication method mixed with RF data that allows two-way, low bandwidth data flow.

Figure 3:
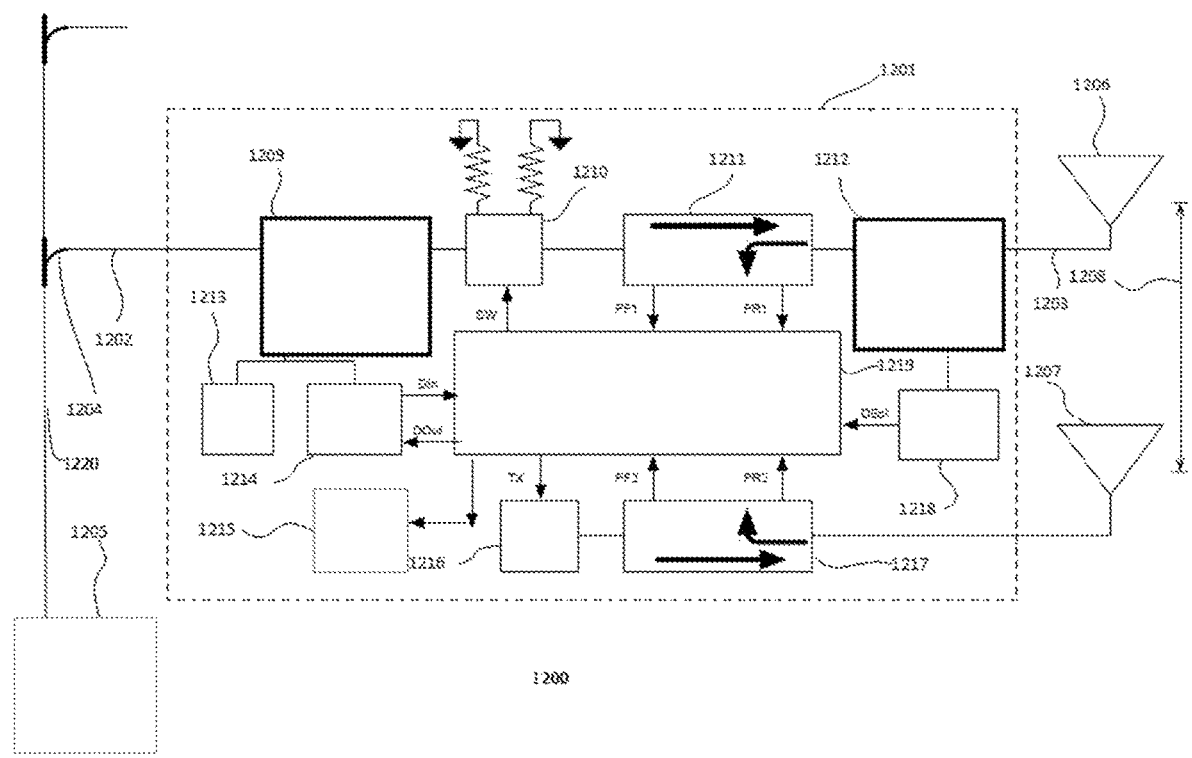
FIG. 3 is a block diagram illustrating an alternate configuration of a distributed antenna system including an antenna monitoring system according to an embodiment of the present invention, in which AC and/or RF signals, or other signals, are used in place of DC signals.

FIG. 3 is a block diagram illustrating a configuration of a distributed antenna system including an antenna monitoring system according to an alternate embodiment of the present invention, in which AC and/or RF and/or high frequency signals/transmissions/communications are used in place of the DC and/or low frequency signals/transmissions/communications that are illustrated in FIG. 1. Functionality of this alternate embodiment, with respect to corresponding reference numerals with numbering differing by one-thousand, may be understood based on the description herein as to FIG. 1, with the understanding that each DC and/or low-frequency signal/transmission/communication may be substituted with an AC and/or RF and/or high-frequency signal, in FIG. 3.

FIG. 3 shows a distributed antenna system 1200 having an exemplary antenna monitoring system 1201 according to an embodiment of the present invention. Exemplary antenna monitoring system 1201 can facilitate testing the connection and the performance of the antenna over existing connections and/or the connections that provide power to the antenna. As shown in FIG. 3, distributed antenna system 1200 can include one or more antenna 1206; 1207, a system transmitter and receiver (Tx/Rx) 1205, power supply 1213, and antenna monitoring system 1201 for each antenna or set of antennas 1206; 1207 electrically coupled thereto, that is, for each antenna or paired or otherwise associated antenna set 1206; 1207 contained in distributed antenna system 1200. The exemplary antenna set 1206; 1207 shown includes both a (optionally ARCS) primary antenna 1206 and also a secondary or test antenna 1207, although, in other embodiments, a single antenna (e.g. 1206) or other combinations of antennas may be used. In certain embodiments, secondary or test antenna 1207 can be used, or used exclusively, for testing purposes. In certain further embodiments, secondary or test antenna 1207 can be included as part of antenna monitoring system 1201. System transmitter and receiver 1205 may be the main system transmitter and receiver for distributed antenna system 1200 and may be used to send and receive radio frequency (RF) signals throughout distributed antenna system 1200 to primary antenna 1206. Tx/Rx 1205 can be electrically coupled to each antenna monitoring system 1201 and primary antenna 1206 via a bidirectional bus 1220. Each antenna monitoring system 1201 and primary antenna 1206 can be electrically coupled to bus 1220 via calibrated splitter 1204. Distributed antenna system 1200 can have any number of antenna 1206 and antenna monitoring system 1201, as desired. For example, if distributed antenna system 1200 is implemented in a building to provide a system for emergency communications (e.g., fire, police, etc.), distributed antenna system 1200 can include an antenna 1206 for each wing or floor of the building. Other designs and implementations of distributed antenna system 1200 are contemplated by embodiments of the present invention.

As shown in FIG. 3, system transmitter and receiver (Tx/Rx) 1205 may be a device or may be comprised of a plurality of devices capable of performing the sending and receiving data to each antenna 1206 in distributed antenna system 1200. For example, Tx/Rx 1205 can send and receive an encoded and/or modulated AC and/or RF and/or high frequency signal having digital and/or analog data throughout distributed antenna system 1200 to primary antenna 1206. According to certain exemplary embodiments, the signal generated by Tx/Rx 1205 can include a AC and/or RF and/or high frequency high-frequency signal having data encoded and/or modulated thereon. For example, the AC and/or RF and/or high frequency signal, in certain embodiments, may be a transmitted RF frequency, and/or may have modulated transmission data (for example, modulated using Amplitude Modulation and/or Frequency Modulation). In certain embodiments, system components such as the Tx/Rx 1205 and/or the antenna monitoring system 1201 may include, for example by being built into such system components, a radio component, which may advantageously facilitate the transmission of such transmitted RF frequency and/or other RF signal and/or AC signal and/or high frequency signal. In certain embodiments the radio may be bi-directional and/or low power. The signal may, in certain embodiments be at or around 345 MHz or the FCC Part 15 unlicensed band of 345 MHz to 370 MHz. Advantageously, such signals may be easy to create. In further embodiments, the generated signal (which may, for example, include information signals and/or control signals) may be transmitted to antenna monitoring system 1201. Signals, in certain embodiments, may be returned from the antenna monitoring system 1201 to the Tx/Rx 1205 in a different form. According to embodiments of the present invention, the signal generated by Tx/Rx 1205 can be provided to each antenna 1206 and antenna monitoring system 1201 via bus 1220 and splitter 1204. Secondary or test antenna 1207 can be used, or used exclusively, for testing purposes. For example, secondary or test antenna 1207 can send communications to primary antenna 1206 to test the reception capabilities of primary antenna 1206, and secondary or test antenna 1207 can receive communications from primary antenna 1206 to test the transmission capabilities of primary antenna 1206. Secondary or test antenna can be 1207 can be included as part of antenna monitoring system 1201.

The antenna monitoring system 1201 or plurality of such systems, for example as embodied in the system described, may have, or be configured to have, a number of advantages. The antenna monitoring system(s) 1201 may indicate in a building or other site database the specific location of each uniquely addressed antenna monitoring system(s) 1201. For example, the specific locations may be manually determined or determined prior to installation and inputted into a storage associated with processor 1219 of each antenna monitoring system 1201, which may in turn be transmitted for storage or periodically signaled to an assigned central or distributed component of the antenna distribution system 1200, such as a database included within or associated with Tx/Rx 1205. The system may selectively indicate an antenna communications failure problem at the specified address and/or building location in the event that the processor 1219 (which may itself be addressable) cannot be communicated with.

Power can be provided throughout distributed antenna system 1200 via bus 1220 and splitter 1204. According to certain exemplary embodiments, the power supply powering distributed antenna system 1200 can include a connection to the power supply of the building in which distributed antenna system 1200 is deployed, or a separate power supply (e.g., a separate connection to the power grid, batteries, generators, emergency backup power, etc.). Preferably, bus 1220 can also carry signals that provide testing of the antenna by antenna monitoring system 1201. According to certain exemplary embodiments, power may be generated by a battery-backed power supply. According to certain embodiments, the voltage may be modulated. Such exemplary pulse-coded system may employ pulse code modulation, Manchester-encoded edges, or a combination thereof. Other methods of pulse-encoding may be used, alternately or in addition to the foregoing. In certain embodiments, the signal may be in a different form when sent by the antenna monitoring system 1201 to Tx/Rx 1205. According to certain exemplary embodiments, a series of current pulses may be sent, such as current pulses at specific time intervals/windows and such signals may be sent using the mere existence of a bit or bits as signal-indicative, or may be coded according to pulse length, pulse code, Manchester encoding, and/or other simple or more complicated coding methods.

As shown in FIG. 3, each antenna monitoring system 1201 and primary antenna 1206 can be electrically coupled to bus 1220 via splitter 1204. Splitter 1204, which may be a calibrated splitter, may be used to portion appropriate amounts of RF energy to each antenna monitoring system 1201 and primary antenna 1206 such that each antenna monitoring system 1201 and primary antenna 1206 receives the AC and/or RF and/or high frequency signal generated by Tx/Rx 1205. According to certain embodiments, splitter 1204 allows for AC and/or RF and/or high frequency signals to be passed-through from bus 1220 to each antenna monitoring system 1201 and primary antenna 1206. Preferably, each antenna monitoring system 1201 and primary antenna 1206 incorporated into distributed antenna system 1200 can be coupled to bus 1220 via splitter 1204. Accordingly, if distributed antenna system 1200 includes ten primary antennas 1206 and ten corresponding antenna monitoring systems 1201, distributed antenna system can include ten splitters 1204, one for each primary antenna 1206 and corresponding antenna monitoring system 1201.

As shown in FIG. 3, embodiments of the present invention can provide antenna monitoring system 1201. Antenna monitoring system 1201 can be electrically coupled to each antenna 1206 to monitor the connection and health of antenna 1206. As shown in FIG. 3, antenna monitoring system 1201 can contain an input block 1209 connected to a power supply 1213, a data transmission and reception device 1214, and an RF switch 1210. The RF switch 1210 can be connected to a directional coupler 1211, which can be connected to an output block 1212, which can be connected to an end of line detection device 1218. The data reception and transmission device 1214, the RF switch 1210, the directional coupler 1211, and the end of line detection device 1218 can be connected to a processor 1219. The processor 1219 can also be connected to indicator lights 1215, an RF transmitter 1216, and a second directional coupler 1217. The RF transmitter 1216 can be connected to the second directional coupler 1217. In certain embodiments, antenna monitoring system 1201 can also include secondary or test antenna 1207, which can facilitate monitoring the health and performance of primary antenna 1206. The antenna monitoring system 1201 according to embodiments of the present invention may optionally have its various components contained internally within a monolithic package and/or may be in the form of a module, or alternately some or all of such components may be distributed and/or not contained within such a package or module. The antenna monitoring system 1201 can operate, in certain embodiments in parallel with other such systems monitoring other antennas, to monitor the status, health, and/or performance of an associated primary antenna 1206, with additional testing options made possible by association with a secondary or test antenna 1207, and to distribute such monitoring information. For example, antenna monitoring system 1201 can receive an encoded and/or modulated low-frequency signal from Tx/Rx 1205 and test the status, connection, health, and/or performance of associated primary antenna 1206. Further, antenna monitoring system 1201 can transmit the status, connection, health, and/or performance of primary antenna 1206 back to Tx/Rx 1205 through the use of associated indicator lights 1215 and/or by passing such monitoring information to the bidirectional bus 1220 and thereby to the transmitter and receiver 1205 (which passing of information can be accomplished through the use of a data reception and transmission device 1214, which may be associated with a power supply 1213 and an input block 1209 with an external connection). The antenna monitoring system 1201 can operate to control the passing of signal information between Tx/Rx 1205 and primary antenna 1206, and also to control the passing of testing information from itself to each of primary antenna 1206 and secondary or test antenna 1207, for example by the use of a processor 1219 controlling settings of a RF switch 1210 (which can cooperate with directional coupler 1211) with respect to the primary antenna 1206, and by signaling and controlling settings of a RF transmitter 1216 (which can cooperate with second directional coupler 1217) with respect to the secondary or test antenna 1207. The antenna monitoring system 1201, in monitoring the primary antenna 1206, can take special advantage of the presence of an end of line detection device 1218 and output block 1212 for detection of electrical flows (or absences thereof) consistent with proper or improper operation of the primary antenna 1206, thereby more efficiently delivering an indication of primary antenna's 1206 operation to processor 1219. In certain additional embodiments, the antenna monitoring system 1201 can also monitor the secondary or test antenna 1207 by taking advantage of the presence of an end of line detection device 1218 for detection of electrical flows (or absences thereof) consistent with proper or improper operation of the secondary or test antenna 1207, thereby more efficiently delivering an indication of secondary or test antenna's 1207 operation to processor 1219. In certain of such additional embodiments, secondary or test antenna 1207 may be connected (not shown) to end of line detection device 1218, for example, to facilitate such detection. Most functions of antenna monitoring system 1201 can be carried out under control of processor 1219. For example, processor 1219 can control transmission and reception of data to a broader distributed antenna system 1200, transmission of a signal between primary antenna 1206 and such distributed antenna system 1200, testing of primary antenna 1206 and secondary or test antenna 1207, and indication of problem, fault, or trouble conditions both locally and more broadly to the distributed antenna system 1200.

Signals, which can be AC and/or RF and/or high frequency signals, and which can include an associated address (which can be uniquely coded) of a particular antenna monitoring system 1201, can be transmitted by Tx/Rx 1205 to antenna monitoring system 1201, or, in embodiments in which the distributed antenna system 1200 has plurality of antenna monitoring systems 1201, to some or all of the antenna monitoring systems 1201. Advantageously, this allows for the transmission of both data and power on the same line or connection. The signal can initially be transmitted from Tx/Rx 1205 (via bidirectional bus 1220, splitter 1204 and wires 1202) to input block 1209 of antenna monitoring system 1201. The input block 1209 may, in certain embodiments, separate DC power and low frequency communication signals from the RF signal path. For example, input block 1209 can include a capacitor or capacitive network, to filter out DC and/or low frequency components from the signal. Accordingly, the AC and/or RF and/or high frequency components of the signal can be provided to data reception and transmission device 1214 and to RF switch 1210, which can be controlled by processor 1219. Such AC and/or RF and/or high frequency components can selectively pass through RF switch 1210 to the directional coupler 1211, for example, according to a setting supplied by the processor 1219. The AC and/or RF and/or high frequency components of the signal, which pass from input block 1209 to data reception and transmission device 1214, can in turn provide the data to processor 1219. Processor 1219 can determine, for example, by comparison of an address associated with the signal and with antenna monitoring system 1201 (or the associated primary antenna 1206), whether the AC and/or RE and/or high frequency components of the signal—and the data provided by same—is intended for the antenna monitoring system 1201 (or the primary antenna 1206 associated therewith). Directional coupler 1211, which can be controlled by processor 1219, can pass the AC and/or RE and/or high frequency components of the signal to output block 1212, which can in turn pass them to primary antenna 1206. Directional coupler 1211 can also send an indication to processor 1219 associated with the directional coupler's transmission of AC and/or RF and/or high frequency components of the signal to primary antenna 1206, or of the primary antenna's 1206 response thereto. Signal flow from the primary antenna 1206 to Tx/Rx 1205 can also occur in the reverse of the directionality as outlined above.

In certain embodiments, signal flow may occur differently. By way of example, signal flow may pass via a direct path (not shown) between RE transmitter 1216 and input block 1209, for example en route to Tx/Rx 1205. By way of an additional example, signals may pass from input block 1209 to processor 1219 via a path passing through a block or other component (not shown) different than data reception and transmission device 1214, or directly.

As described herein, antenna monitoring system 1201 can perform tests to determine the status, connection, health, and/or performance of primary antenna 1206. For example, to test the connection of primary antenna 1206, an element (e.g., a inductor, resistor, or other circuit component) can be used. To do so, a signal can be sent to primary antenna 206 through a capacitor or capacitive elements of output block 1212, and thereby a AC and/or RF and/or high frequency component of the signal can be delivered to the primary antenna 1206, which primary antenna 1206 can have an embedded element (which can be, for example, an inductor and/or resistor, or other known circuit element(s) embedded within or associated with primary antenna 1206). For example, the embedded element can include an inductor in series with a resistor. The presence of a characteristic response to the signal by the embedded element can be determined by end of line detection device 1218. For example, end of line detection device 1218 can perform a comparison of the measured value against the expected value to determine the presence or absence of electronic data consistent with the presence and/or proper functioning of primary antenna 1206 (which can include the connection, reception, specification-conformity and/or transmission status of the primary antenna 1206). For example, a determination can be made as to whether there is a match between the indicative output data from output block 1212 and that known by end of line detection device 1218 to normally be received during functional operation of primary antenna 1206 (i.e. when primary antenna 1206 is successfully sending and receiving messages from Tx/Rx 1205). End of line detection 1218 device can then transmit its determination to processor 1219. Alternately, such determination can be made by the processor 1219.

Antenna monitoring system 1201 can also facilitate testing of the connectivity of primary antenna 1206. For example, testing of the primary antenna 1206 performance can be performed using Voltage Standing Wave Ratio (VSWR) measurements. To perform such a VSWR measurement to test the connectivity of the primary antenna 1206 along with its associated wiring (for example, the wiring between the processor 1219 or end of line detection device 1218, on the one hand, and primary antenna 1206 on the other), power can be transmitted to the primary 1206 and compared to reflected power back from primary antenna 1206 to obtain a ratio of the transmitted power compared to the reflected power. In performing a VSWR measurement, a ratio of 1:1 of transmitted to reflected power, for example, would be ideal, and a ratio of 1:2.5 of transmitted to reflected power or worse may be indicative of a problem or fault condition such as a disconnected primary antenna 1206, a faulty connection, or an inefficient antenna design, and may result in the sending of an indication signal of the problem via the processor as discussed herein. The VSWR determination can be made by the processor 1219 based on the AC and/or high frequency components of the received reflection and/or accompanying indications of reception strength relative to the test power sent. In certain embodiments, the VSWR determination can involve a determination of whether the VSWR measurement is equivalent to or better than results obtained when the primary antenna 1206 is known to be functioning correctly, or than a supplied fixed threshold value. The VSWR measurement can be determined, for example, according to the formula $(1+|\text{reflection coefficient}|)/(1-|\text{reflection coefficient}|)$. The VSWR and reflection coefficient can be determined according to the various voltage measurements (or amplitude) of the reflected voltage wave associated with the indicative output data. In certain embodiments, the VSWR can be performed with the primary antenna operating at or around 345 MHz, or around 345 MHz to 370 MHz. Local RF voltage may be used in the VSWR measurement.

There can also be testing of the primary antenna 1206 using a test transmission from secondary or test antenna 1207. For example, a test transmission may be sent to the secondary or test antenna 1207 by the processor 1219, via the second directional coupler 1217 (under the control of the RF transmitter 1216 which can be under the control of processor 1219) to the secondary or test antenna 1207. The test antenna 1207 then transmits the test transmission. The test transmission can be made, for example as shown in FIG. 2B at 345 MHz, and received at the primary antenna 1206. The received test transmission and/or accompanying indications of reception strength can pass from primary antenna 1206 to output block 1212, and then by passing through a capacitor or capacitive element of output block 1212 AC and/or RF and/or high frequency components thereof can be passed to directional coupler 1211 and ultimately back to processor 1219, for example through PF1 and/or PR1 outputs of directional coupler 1211.

To perform a measurement to test the transmission capabilities of the primary antenna 1206 using a test transmission to secondary or test antenna 1207, a test transmission can be sent to the primary antenna 1206 by the processor 1219, via the directional coupler 1211 (under the control of the RF switch 1210 which can be under the control of processor 1219) and output block 1212. The primary antenna 1206 then transmits the test transmission. The test transmission can be made, for example as shown in FIG. 2B at 345 MHz, and received at the secondary or test antenna 1207. The received test transmission and/or accompanying indications of reception strength can pass from secondary or test antenna 1207 to second directional coupler 1217 and ultimately back to processor 1219, for example through PF2 and/or PR2 outputs of second directional coupler 1217. The determination can be made by the processor 1219 based on the received test transmission and/or accompanying indications of reception strength.

With respect to the spacing of primary antenna 1206 and secondary or test antenna 1207 associated with an antenna monitoring system 1201, in certain embodiments, the distance 1208 between the primary antenna 1206 and the secondary or test antenna 1207 (which may in certain embodiments be included as part of the antenna monitoring system 1201) may be approximately two times the wavelength of the signals used by the system. In other embodiments, the distance 1208 may be equal to two times the wavelength of the signals used by the system. In yet other embodiments, the distance 1208 may be greater than or equal to approximately two times the wavelength of the signals used by the system. In yet more embodiments, the distance 1208 may be greater than or equal to two times the wavelength of the signals used by the system. In additional embodiments, the distance 1208 may be greater than two times the wavelength of the signals used by the system.

An indication signal can be outputted by the processor if a determination is made that there is a problem with primary antenna 1206, or if there is any other problem, fault, or trouble condition. Such indication signal can be outputted by processor 1219 to Tx/Rx 1205 (for example via data reception and transmission device 1214, input block 1209, wire 1202, splitter 1204, and bidirectional bus 1220) and/or to indicator lights 1215 so as to indicate to a user or repair person that there is, or the nature of, a problem with primary antenna 1206. For example, the indication signal can report that there is a problem with the primary antenna 1206 as determined based on the end of line detection device's determination that there was a failure to match an expected characteristic of embedded elements of primary antenna 1206. The indication signal can also report that there is a problem with the primary antenna's 1206 reception or transmission capabilities as measured at the processor 1219 using VSWR measurement based on transmissions between the primary antenna 1206 and the secondary or test antenna 1207.

Additional methodologies may be employed for the purposes of confirming whether or not antennas are operational and their signal strength. In certain embodiments, the RF switch 1210 may be used to enable and/or disable the signal path to primary antenna 1206. This may be done upon a command from the transmitter and receiver (Tx/Rx) 1205 and/or its cabinet, which may be processed and acted upon, by the sending of a signal to RF switch 1210, by processor 1219. The performance of another, remaining, connected antenna within the building may be tested. Advantageously, this test may ensure there is enough redundant coverage when an antenna is missing. A lower or higher transmission level to primary antenna 1206 may be selected. This may advantageously allow signal coverage to be modified, and advantageously this may be done without replacing equipment and/or adding attenuators, thereby saving labor and material costs. A single-service technician walk-testing sequence may be performed. In such a walk-testing sequence, one antenna may be enabled at a time, and one or more or all of the various antennas may be enabled sequentially. Primary antenna 1206, for example if it is determined to have a physical failure, may be turned off. This may advantageously prevent primary antenna 1206 from affecting other antennas in the system.

Advantageously, according to various of the above-described embodiments, some or all system faults may be detected. The system faults may advantageously be repaired, and this may occur before a firefighter or other individual or system relies on the system performance. The verification processes may be used at all or nearly all times, e.g. 24/7. Power supply 1213 may be used to store and/or stabilize available operating power, which operating power may be AC and/or RF and/or high frequency operating power. The power from the power supply 1213 may be distributed, for example, throughout one or more or all of the other components of the antenna monitoring system 1201, and/or the primary antenna 1206, and or the secondary or test antenna 1207, (for example, in those embodiments in which such secondary or test antenna may not be part of antenna monitoring system 1201) and/or the communications infrastructure to the bidirectional bus 1220 such as wire 1202 and splitter 1204 or any repeaters or other infrastructure such as may be necessary to ensure signal reception and delivery. In some embodiments, talk/listen system signals and operational power, such as AC and/or RF and/or high frequency power and such as for the distributed antenna electronics and/or the communication signals for uplink and downlink operation may be delivered over the same RF cable.

Although the invention has been described with reference to a particular arrangement of parts, features and the like, these are not intended to exhaust all possible arrangements or features, and indeed many other modifications and variations will be ascertainable to those of skill in the art. The embodiments and examples shown above are illustrative, and many variations can be introduced to them without departing from the spirit of the disclosure. For example, elements and/or features of different illustrative and exemplary embodiments herein may be combined with each other and/or substituted with each other within the scope of the disclosure. For a better understanding of the disclosure, reference should be had to any accompanying drawings and descriptive matter in which there is illustrated exemplary embodiments of the present invention.

What is claimed is:

1. An antenna monitoring module electrically coupled to an antenna, the antenna monitoring module comprising:
   an embedded element in the antenna;
   a test antenna configured to send and receive radio frequency (RF) test signals to and from the antenna;
   an input blocking module disposed at an input of the antenna monitoring module to facilitate receipt of a master test signal by the antenna monitoring module; and
   an addressable mixed signal processor that determines an integrity of a connection to the antenna and a performance of the antenna based on measurements associated with the RF test signals and the master test signal.

2. The antenna monitoring module of claim 1, wherein the input blocking module includes an input direct current (DC) blocking module.

3. The antenna monitoring module of claim 1, further comprising a direct current (DC) output blocking module disposed at an output of the antenna monitoring module to the antenna.

4. The antenna monitoring module of claim 1, further comprising an end of line detection module in communication with the addressable mixed signal processor to compare measurements associated with the embedded element and the master test signal against an expected value to determine the integrity of the connection to the antenna.

5. The antenna monitoring module of claim 4, wherein the embedded element includes at least one of an inductor, a resistor, and a capacitor.

6. The antenna monitoring module of claim 1, wherein the addressable mixed signal processor is configured to compare voltage standing wave ratio (VSWR) measurements associated the RF test signals against an expected VSWR value to determine the performance of the antenna.

7. The antenna monitoring module of claim 1, further comprising a directional coupler controlled by the addressable mixed signal processor and configured to pass signals between the input block module and the antenna.

8. The antenna monitoring module of claim 7, further comprising a second directional coupler controlled by the addressable mixed signal processor and configured to pass signals between an RF transmitter and the test antenna.

9. The antenna monitoring module of claim 7, further comprising an RF switch in communication with the addressable mixed processor and with the directional coupler to selectively facilitate transmission by the directional coupler.

10. The antenna monitoring module of claim 1, further comprising a calibrated splitter connected to the input blocking module to electrically couple the antenna monitoring module to a distributed antenna network.

11. The antenna monitoring module of claim 1 further comprising indicator lights configured to be selectively controlled by the addressable mixed signal processor based on the determination of the integrity of the connection to the antenna and the performance of the antenna.

12. The antenna monitoring module of claim 1, wherein the processor is adapted to perform bidirectional communication with a global transmitter and receiver.

13. The antenna monitoring module of claim 12, wherein the bidirectional communication is by pulse-coded DC signal, a series of current pulses, AM radio signal, or FM radio signal.

14. The antenna monitoring system of claim 1, wherein the distance between the antenna and the test antenna is at least two times the wavelength of signals used by the antenna monitoring system.

15. The antenna monitoring system of claim 1, wherein the master test signal includes power and encoded data.

16. A distributed antenna network comprising:
a plurality of antennas;
a global transmitter and receiver; and
an antenna monitoring module associated with each of the plurality of antennas, the antenna monitoring module electrically coupled to the global transmitter and receiver via a calibrated splitter and including an element embedded in the antenna, a test antenna configured to send and receive radio frequency (RF) test signals to and from the antenna, an input blocking module disposed at an input of the antenna monitoring module to facilitate receipt of a master test signal from the global transmitter by the antenna monitoring module, and an addressable mixed signal processor that determines an integrity of a connection to the antenna and a performance of the antenna based on the RF test signals and the master test signal.

17. The antenna monitoring system of claim 16, wherein the at least one calibrated splitter comprises a plurality of calibrated splitters, and wherein the at least one antenna monitoring module comprises a plurality of antenna monitoring modules each electrically coupled to one of the plurality of calibrated splitters.

18. The antenna monitoring system of claim 17, wherein the plurality of calibrated splitters are DC pass-through calibrated splitters adapted to portion out RF energy to the plurality of antenna monitoring modules.

19. The antenna monitoring system of claim 18, wherein the plurality of splitters allow for flow of low frequency data between the global transmitter and receiver and the plurality of antenna monitoring modules.

20. The antenna monitoring system of claim 17, further comprising a main power source, wherein power provided by the main power source is presented to the plurality of calibrated splitters and the plurality of antenna monitoring modules.

21. The antenna monitoring system of claim 16, wherein the distance between the antenna and the test antenna monitored is at least two times the wavelength of signals used by the at least one monitoring module.

* * * * *